(12) United States Patent  
Wang et al.

(10) Patent No.: US 12,553,148 B2
(45) Date of Patent: Feb. 17, 2026

(54) PREPARATION METHOD OF ALUMINUM NITRIDE COMPOSITE STRUCTURE BASED ON TWO-DIMENSIONAL (2D) CRYSTAL TRANSITION LAYER

(71) Applicant: PEKING UNIVERSITY, Beijing (CN)

(72) Inventors: Xinqiang Wang, Beijing (CN); Fang Liu, Beijing (CN); Zhaoying Chen, Beijing (CN); Bowen Sheng, Beijing (CN); Yucheng Guo, Beijing (CN); Bo Shen, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 259 days.

(21) Appl. No.: 18/499,095

(22) Filed: Oct. 31, 2023

(65) Prior Publication Data

US 2024/0141549 A1  May 2, 2024

(30) Foreign Application Priority Data

Nov. 1, 2022 (CN) .......................... 202211354352.8

(51) Int. Cl.
*C30B 25/04* (2006.01)
*C30B 25/18* (2006.01)
*C30B 29/40* (2006.01)
*C30B 33/00* (2006.01)

(52) U.S. Cl.
CPC ............ *C30B 25/04* (2013.01); *C30B 25/186* (2013.01); *C30B 29/403* (2013.01); *C30B 33/005* (2013.01)

(58) Field of Classification Search
CPC ..... C30B 25/04; C30B 25/186; C30B 29/403; C30B 33/005; C30B 33/06; H01L 21/0242; H01L 21/0243; H01L 21/02444; H01L 21/02458; H01L 21/02485; H01L 21/02502; H01L 21/02513; H01L 21/02527; H01L 21/0254; H01L 21/02631; H01L 21/02639; H01L 21/02658; H10H 20/01335; H10H 20/815; Y02P 70/50

See application file for complete search history.

(56) References Cited

U.S. PATENT DOCUMENTS

2013/0288459 A1\* 10/2013 Wei .................. H01L 21/02444
                                                                        438/478

\* cited by examiner

*Primary Examiner* — Hua Qi
(74) *Attorney, Agent, or Firm* — Birchwood IP

(57) ABSTRACT

A preparation method of an aluminum nitride (AlN) composite structure based on a two-dimensional (2D) crystal transition layer is provided. The preparation method includes: transferring the 2D crystal transition layer on a first periodic groove of an epitaxial substrate; forming a second periodic groove staggered with the first periodic groove on the 2D crystal transition layer; depositing a supporting protective layer; depositing a functional layer of a required AlN-based material; and removing the 2D crystal transition layer through thermal oxidation to obtain a semi-suspended AlN composite structure. The preparation method has low difficulty and is suitable for large-scale industrial production. Design windows of the periodic grooves and the AlN functional layer are large and can meet the material requirements of deep ultraviolet light-emitting diodes (DUV-LEDs) and radio frequency (RF) electronic devices for different purposes, resulting in a wide application range.

10 Claims, 4 Drawing Sheets

PREPARATION METHOD OF ALUMINUM NITRIDE COMPOSITE STRUCTURE BASED ON TWO-DIMENSIONAL (2D) CRYSTAL TRANSITION LAYER

CROSS-REFERENCE TO RELATED APPLICATION

This application claims foreign priority benefits under 35 U.S.C. § 119(a)-(d) to Chinese Patent Application No. 202211354352.8 filed on Nov. 1, 2022, which is hereby incorporated herein by reference in its entirety.

TECHNICAL FIELD

The present disclosure relates to a preparation technology for an aluminum nitride film, and specifically relates to a preparation method of an aluminum nitride composite structure based on a two-dimensional (2D) crystal transition layer.

BACKGROUND

Deep ultraviolet light-emitting diodes (DUV-LEDs) have advantages such as excellent monochromaticity, high luminous power, safety and non-toxicity, and portability, and thus, application scenarios of DUV-LEDs have gradually expanded from the original sterilization to fields such as lighting, medical care, printing, biochemical detection, high-density information storage, and confidential communication. However, compared with gallium nitride-based blue light-emitting diodes that have been maturely used, DUV-LEDs still have a series of shortcomings such as low quantum efficiency (QE) and low reliability. This is because high-quality epitaxial substrates transparent to deep ultraviolet (DUV) bands have become one of the important bottlenecks hindering the further development of this direction. In particular, high-quality aluminum nitride (AlN)/epitaxial substrate composite structures as substrates are crucial for nitride-based DUV-LEDs. In addition, an AlN-based composite structure is an important substrate for preparation of a high-performance radio frequency (RF) electronic device, and has a great development potential in fields such as consumer electronics and perception detection. The development of a preparation solution for a novel AlN-based composite structure, especially a preparation solution for a semi-suspended AlN-based composite structure, is of great significance to solve the heat dissipation problem of DUV-LEDs and develop novel RF electronic devices.

SUMMARY

The present disclosure provides a preparation method of an aluminum nitride composite structure based on a 2D crystal transition layer. In the preparation method, a periodic groove is formed on a surface of an epitaxial substrate, then the 2D crystal transition layer is transferred on the epitaxial substrate to obtain a flat-layer structure, and then an AlN functional layer is prepared to obtain a semi-suspended AlN composite structure that is suspended above a groove zone and is not suspended above a non-groove zone.

The present disclosure provides a preparation method of an aluminum nitride composite structure based on a 2D crystal transition layer, including the following steps:
1) providing an epitaxial substrate;
2) forming a first periodic groove on a surface of the epitaxial substrate by a mask etching technique, where a zone outside the first periodic groove on the epitaxial substrate is a first non-groove zone, and a depth of the first periodic groove is less than a thickness of the epitaxial substrate;
3) transferring a 2D crystal transition layer to the surface of the epitaxial substrate on which the first periodic groove is located to cover the first periodic groove and the first non-groove zone on the epitaxial substrate to produce a flat-layer structure;
4) etching a part of the 2D crystal transition layer on the first non-groove zone by the mask etching technique to form a second periodic groove, where a zone outside the second periodic groove on the 2D crystal transition layer is a second non-groove zone; a depth of the second periodic groove is equal to a thickness of the 2D crystal transition layer; a period of the second periodic groove is equal to a period of the first periodic groove; the second periodic groove is parallel to the first periodic groove; and a planar projection of the second periodic groove falls in the first non-groove zone;
5) depositing a supporting protective layer on a surface of the second non-groove zone of the 2D crystal transition layer to enhance a mechanical strength of the 2D crystal transition layer and prevent a collapse at a position of the first periodic groove during subsequent deposition of an AlN functional layer, where a plane shape of the supporting protective layer is consistent with a plane shape of the second non-groove zone;
6) depositing an AlN-based material on a surface of the supporting protective layer, such that the AlN-based material fills a space between the second periodic groove and the supporting protective layer and covers a part of the supporting protective layer corresponding to the second periodic groove and the second non-groove zone to form a functional layer;
7) removing the 2D crystal transition layer through thermal oxidation to obtain a semi-suspended functional layer; and
8) depositing a surface-conductive layer on the semi-suspended functional layer to obtain a semi-suspended AN composite structure.

In step 1), the epitaxial substrate is one selected from the group consisting of monocrystalline substrates of sapphire ($Al_2O_3$), silicon (Si), silicon carbide (SiC), diamond, and mica substrates or one selected from the group consisting of non-monocrystalline substrates of quartz, molybdenum (Mo), and silica/silicon composite substrates; and the thickness of the epitaxial substrate is greater than 100 μm.

In step 2), a photolithography, masking, reactive ion etching (RIE), or plasma etching process is used to etch a plurality of grooves with parallel edges on the surface of the epitaxial substrate to form the first periodic groove; two ends of each groove penetrate to edges of the epitaxial substrate, respectively; a depth of each groove is a, and a is larger than or equal to 100 nm; a width of each groove is b, and b is larger than or equal to 500 nm; and a spacing between two adjacent grooves is not less than 2.5b.

In step 3), a material of the 2D crystal transition layer is graphene or a transition metal dichalcogenide (TMDC); the thickness of the 2D crystal transition layer is larger than 10 nm, and a horizontal size of the 2D crystal transition layer is the same as a horizontal size of the epitaxial substrate; and the 2D crystal transition layer is transferred to the surface of the first periodic groove of the epitaxial substrate in an alignment manner to completely cover the surface of the epitaxial substrate.

In step 4), a photolithography, masking, RIE, or plasma etching process is used to etch a plurality of grooves with parallel edges on the surface of the 2D crystal transition layer to form the second periodic groove; an edge of each groove penetrates to an edge of the epitaxial substrate; a width of each groove is less than 0.8 b, and a spacing between two adjacent grooves is not less than 2.5 b; and the period of the second periodic groove is equal to the period of the first periodic groove, that is, a sum of the width of each groove in the second periodic groove and the spacing between two adjacent grooves is equal to a sum of the width of each groove in the first periodic groove and the spacing between two adjacent grooves, and a number of grooves in the second periodic groove is equal to a number of grooves in the first periodic groove.

In step 5), photolithography, masking, and plasma-enhanced chemical vapor deposition (PECVD) processes are used to deposit a 5 nm to 100 nm-thick support protective layer on the second non-groove zone with a deposition temperature of higher than 100° C.; and a material of the supporting protective layer is selected from the group consisting of amorphous silica ($SiO_2$), alumina ($Al_2O_3$), and titanium oxide ($TiO_2$).

In step 6), the AlN-based material is deposited on the functional layer by physical vapor deposition (PVD), metal organic chemical vapor deposition (MOCVD), molecular beam epitaxy (MBE), hydride vapor phase epitaxy (HVPE), chemical vapor deposition (CVD), or pulsed laser deposition (PLD) at 300° C. to 1,300° C. to form the functional layer; the AlN-based material is one selected from the group consisting of pure aluminum nitride (AlN), pure aluminum gallium nitride (AlGaN), pure scandium aluminum nitride (ScAlN), and a heterostructure composed of two or more of AlN, AlGaN, and ScAlN; and a thickness of the functional layer is greater than 500 nm, that is, a height from an upper surface of the functional layer to an upper surface of the supporting protective layer is greater than 500 nm.

In step 7), the thermal oxidation is conducted for more than 30 min in an oxygen atmosphere at 100° C. to 500° C., such that a structure of the 2D crystal transition layer is destroyed through a chemical reaction participated by oxygen to remove the 2D crystal transition layer.

In step 8), the surface-conductive layer is a graphene layer or a carbon layer; the graphene layer has a thickness of greater than 30 atomic layers and an electric resistivity of less than 300 Ω·m and is prepared through wet transfer, dry transfer, or CVD epitaxial growth; and the carbon layer has a thickness of greater than 10 nm and an electric resistivity of less than 300 Ω·m and is prepared through magnetron sputtering, PVD, MBE, or CVD. The AlN composite structure is semi-suspended, where the functional layer above the first periodic groove is suspended and is not in contact with the epitaxial substrate, and the functional layer above the first non-groove zone is not suspended.

The present disclosure has the following advantages:

The preparation method of the present disclosure includes: transferring the 2D crystal transition layer on a first periodic groove of an epitaxial substrate; forming a second periodic groove staggered with the first periodic groove on the 2D crystal transition layer; depositing a supporting protective layer; depositing a functional layer of a required AlN-based material; and removing the 2D crystal transition layer through thermal oxidation to obtain a semi-suspended AlN composite structure. The preparation method of the present disclosure has low difficulty and is suitable for large-scale industrial production. Design windows of the periodic grooves and the AlN functional layer are large and can meet the material requirements of DUV-LEDs and RF electronic devices for different purposes, resulting in a wide application range.

DETAILED DESCRIPTION

The present disclosure will be further described below through a specific embodiment with reference to the accompanying drawings.

Figure 5:
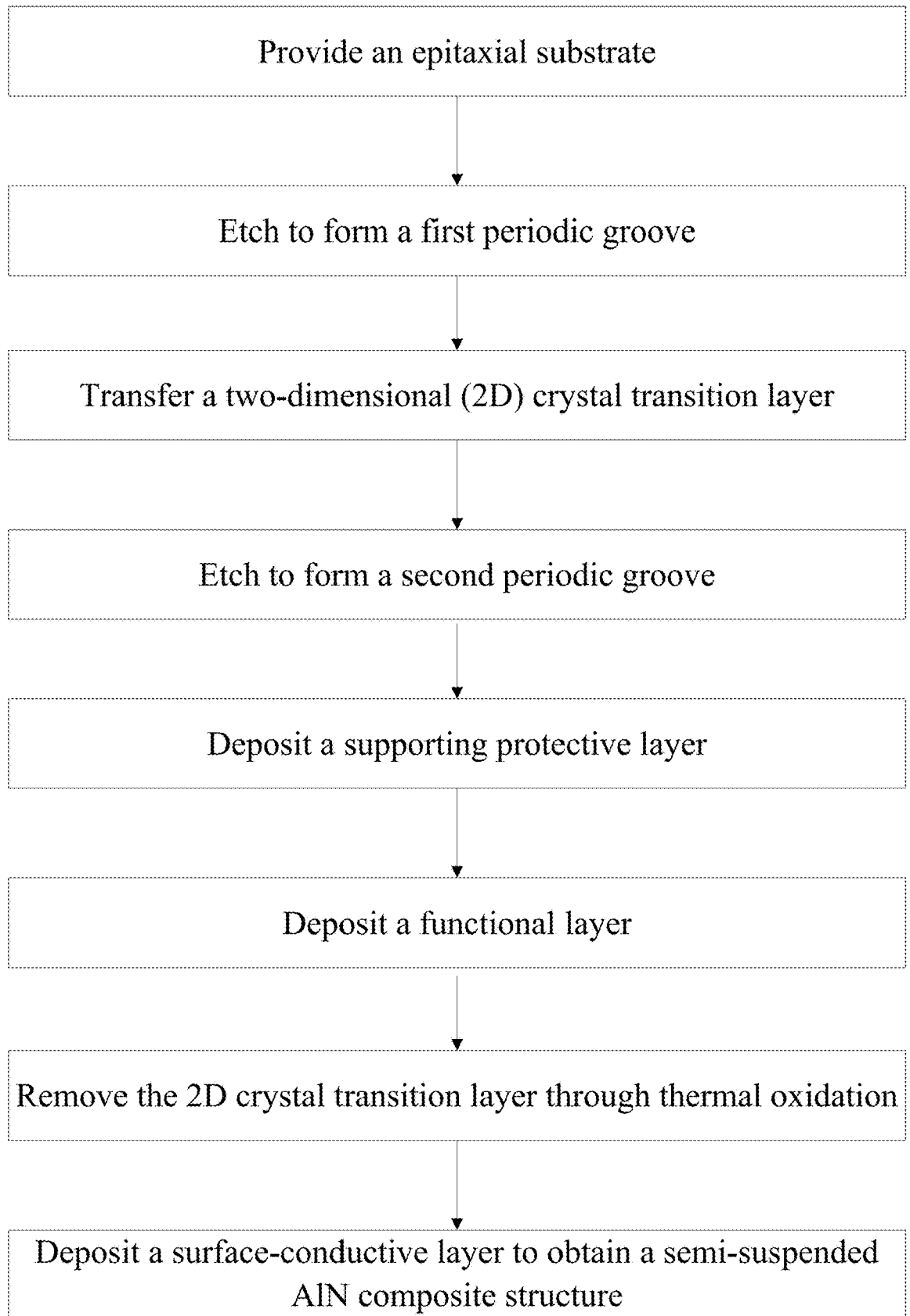
FIG. 5 shows an embodiment of the preparation method of an aluminum nitride composite structure based on a 2D crystal transition layer in the present disclosure.

In an embodiment, a preparation method of an aluminum nitride composite structure based on a 2D crystal transition layer is provided, as shown in FIG. 5, including the following steps:

1) A 4-inch (0001) crystal plane $Al_2O_3$ with a thickness of 450 μm is provided as an epitaxial substrate 1.

Figure 1:
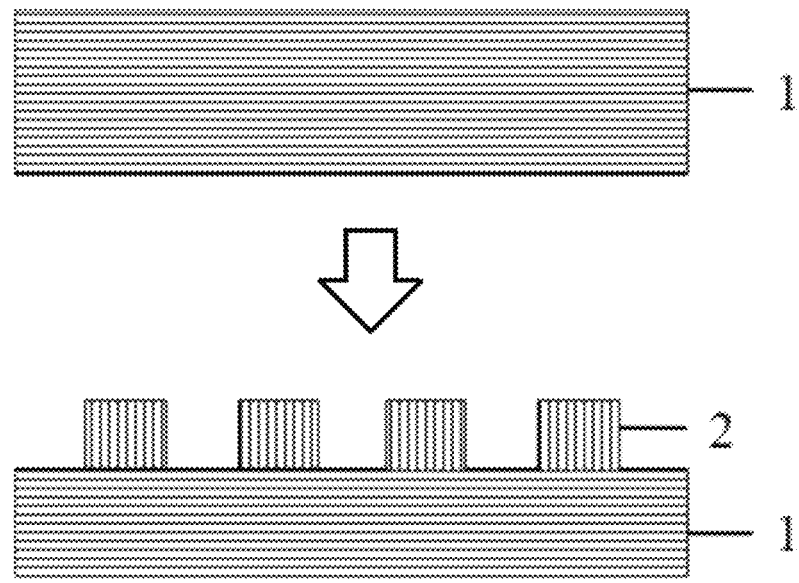
FIG. 1 is a schematic diagram of a first periodic groove obtained in an embodiment of the preparation method of an aluminum nitride composite structure based on a 2D crystal transition layer in the present disclosure.

2) A photolithography, masking, or RIE process is used to etch a plurality of grooves with parallel edges on a surface of the epitaxial substrate to form a first periodic groove, where two ends of each groove penetrate to edges of the epitaxial substrate, respectively; a depth of each groove is a=200 nm; a width of each groove is b=800 nm; a spacing between two adjacent grooves is 2,000 nm; and a zone outside the first periodic groove of the epitaxial substrate is a first non-groove zone 2, as shown in FIG. 1.

3) A 2D crystal transition layer 3 is transferred to the surface of the epitaxial substrate on which the first periodic groove is located, where a material of the 2D crystal transition layer is graphene, and the 2D crystal transition layer has a thickness of 20 nm and the same horizontal size as the epitaxial substrate; and the 2D crystal transition layer is transferred to the surface of the epitaxial substrate on which the first periodic groove is located in an alignment manner to completely cover the first periodic groove and the first non-groove zone on the epitaxial substrate to produce a flat-layer structure.

Figure 2:
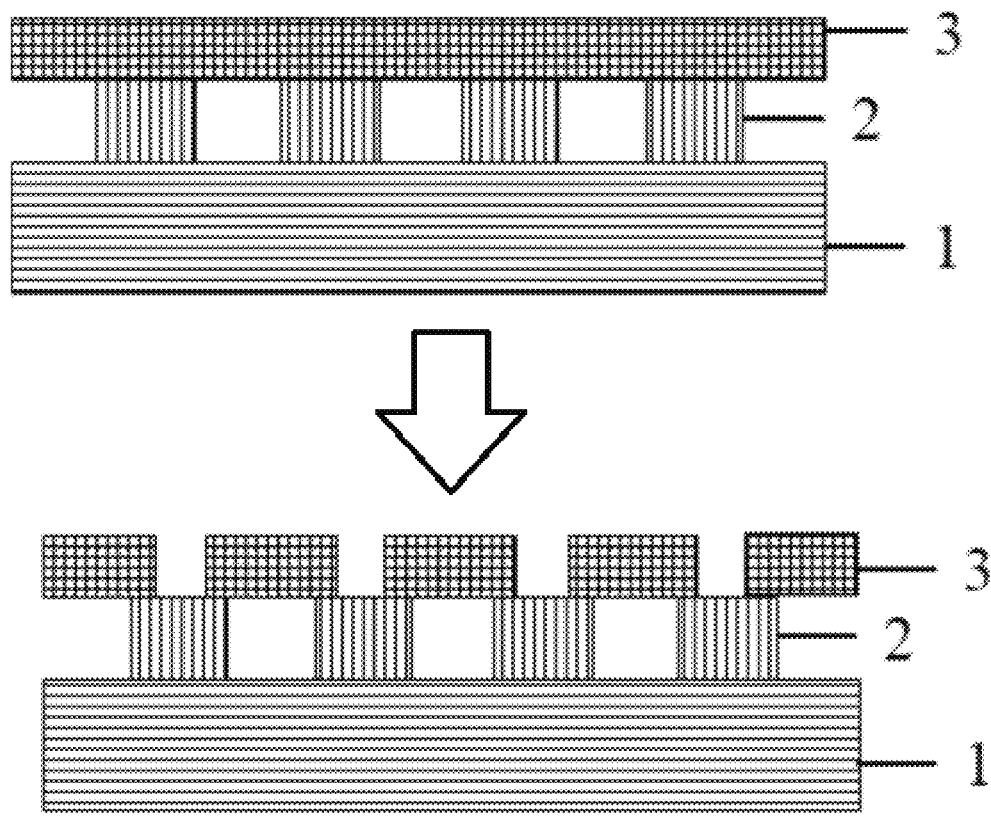
FIG. 2 is a schematic diagram of a second periodic groove obtained in an embodiment of the preparation method of an aluminum nitride composite structure based on a 2D crystal transition layer in the present disclosure.

4) A photolithography, masking, or RIE process is used to etch a plurality of grooves with parallel edges on a surface of the 2D crystal transition layer to form a second periodic groove, where an edge of each groove penetrates to an edge of the epitaxial substrate; a depth of each groove is equal to the thickness of the 2D crystal transition layer and is 20 nm, a width of each groove is 400 nm, and a spacing between two adjacent grooves is 2,400 nm; a period of the second periodic groove is equal to a period of the first periodic groove, that is, a sum of the width of each groove in the second periodic groove and the spacing between two adjacent grooves is equal to a sum of the width of each groove in the first periodic groove and the spacing between two adjacent grooves and is 2,800 nm, and a number of grooves in the second periodic groove is equal to a number of grooves in the first periodic groove; the second periodic groove is parallel to the first periodic groove, and a planar projection of the second periodic groove falls in the first non-groove zone; and a zone outside the second periodic groove of the 2D crystal transition layer is a second non-groove zone, as shown in FIG. 2.

5) Photolithography, masking, and PECVD processes are used to deposit a 20 nm-thick $SiO_2$ supporting protective layer 4 on the second non-groove zone with a deposition temperature of 300° C. to enhance a mechanical strength of the 2D crystal transition layer and prevent a collapse at a position of the first periodic groove during subsequent deposition of an AlN functional layer.

Figure 3:
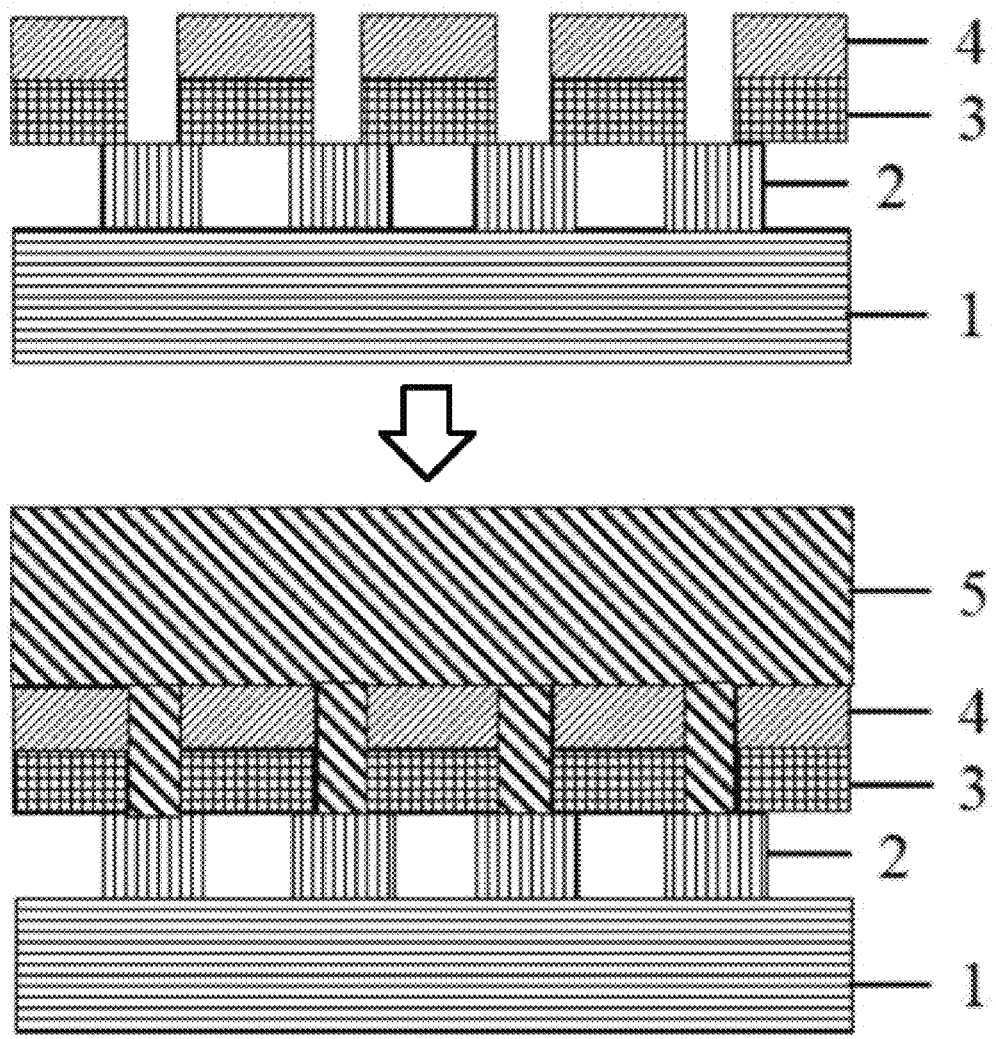
FIG. 3 is a schematic diagram of a supporting protective layer obtained in an embodiment of the preparation method of an aluminum nitride composite structure based on a 2D crystal transition layer in the present disclosure.
Figure 4:
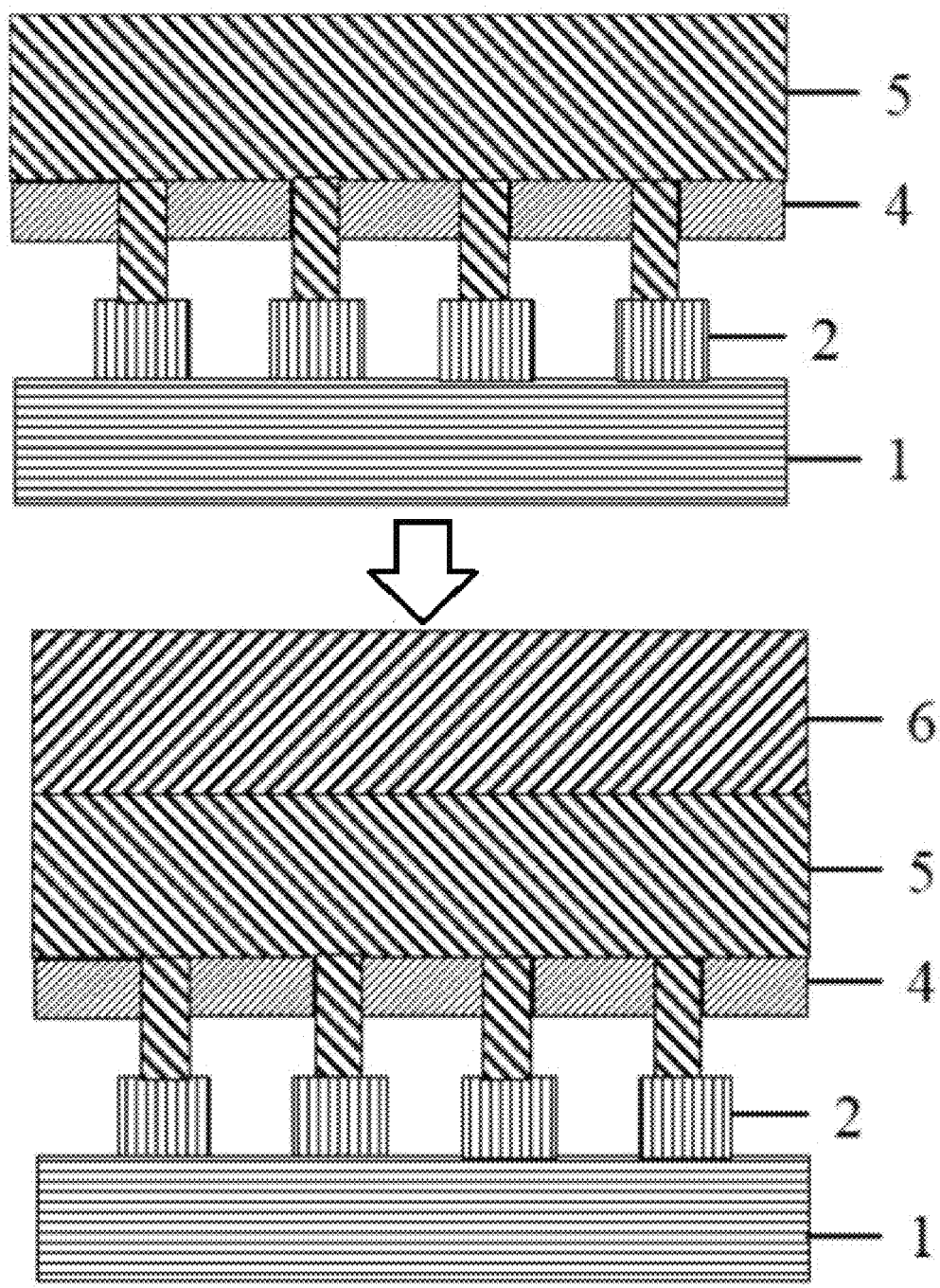
FIG. 4 is a schematic diagram of an aluminum nitride composite structure obtained in an embodiment of the preparation method of an aluminum nitride composite structure based on a 2D crystal transition layer in the present disclosure.

6) Aluminum nitride is deposited on a surface of the second periodic groove by PVD with a deposition temperature of 600° C. and a deposition thickness of 1,000 nm, such that aluminum nitride fills a space between the second periodic groove and the supporting protective layer and covers a part of the supporting protective layer corresponding to the second periodic groove and the second non-groove zone to form a functional layer 5, as shown in FIG. 3. The 2D crystal transition layer is removed through thermal oxidation to obtain a semi-suspended functional layer, where the thermal oxidation is conducted for 45 min in an oxygen atmosphere at 300° C., such that a structure of the 2D crystal transition layer is destroyed through a chemical reaction participated by oxygen. A surface-conductive layer 6 is deposited on the semi-suspended functional layer to obtain a semi-suspended AlN composite structure, where the surface-conductive layer is a graphene layer with a thickness of 50 atomic layers and an electric resistivity of less than 300 $\Omega \cdot m$, and is prepared through wet transfer, as shown in FIG. 4.

Finally, it should be noted that the embodiment is intended to help further understand the present disclosure. However, those skilled in the art can understand that various substitutions and modifications may be made without departing from the spirit and scope of the present disclosure and the appended claims. Therefore, the present disclosure should not be limited to the content disclosed in the embodiment, and the protection scope claimed by the present disclosure is subject to the scope defined by the claims.

What is claimed is:

1. A preparation method of an aluminum nitride (AlN) composite structure based on a two-dimensional (2D) crystal transition layer, comprising the following steps:
    1) Providing an epitaxial substrate;
    2) Forming a first periodic groove on a surface of the epitaxial substrate by a mask etching technique, wherein a zone outside the first periodic groove on the epitaxial substrate is a first non-groove zone, and a depth of the first periodic groove is less than a thickness of the epitaxial substrate;
    3) Transferring the 2D crystal transition layer to the surface of the epitaxial substrate on which the first periodic groove is located to cover the first periodic groove and the first non-groove zone on the epitaxial substrate to produce a layer structure;
    4) Etching a part of the 2D crystal transition layer on the first non-groove zone by the mask etching technique to form a second periodic groove, wherein a zone outside the second periodic groove on the 2D crystal transition layer is a second non-groove zone; a depth of the second periodic groove is equal to a thickness of the 2D crystal transition layer; a period of the second periodic groove is equal to a period of the first periodic groove; the second periodic groove is parallel to the first periodic groove; and a planar projection of the second periodic groove falls in the first non-groove zone;
    5) Depositing a supporting protective layer on a surface of the second non-groove zone of the 2D crystal transition layer to enhance a mechanical strength of the 2D crystal transition layer and prevent a collapse at a position of the first periodic groove during subsequent deposition of an AlN functional layer, wherein a plane shape of the supporting protective layer is consistent with a plane shape of the second non-groove zone;
    6) Depositing an AlN-based material on a surface of the supporting protective layer, such that the AlN-based material fills a space between the second periodic groove and the supporting protective layer and covers a part of the supporting protective layer corresponding to the second periodic groove and the second non-groove zone to form a functional layer;
    7) Removing the 2D crystal transition layer through thermal oxidation to obtain a semi-suspended functional layer; and
    8) Depositing a surface-conductive layer on the semi-suspended functional layer to obtain the AlN composite structure.

2. The preparation method according to claim 1, wherein in step 1), the epitaxial substrate is one selected from the group consisting of monocrystalline substrates of sapphire ($Al_2O_3$), silicon (Si), silicon carbide (SiC), diamond, and mica substrates or one selected from the group consisting of non-monocrystalline substrates of quartz, molybdenum (Mo), and silica/silicon composite substrates; and the thickness of the epitaxial substrate is greater than 100 μm.

3. The preparation method according to claim 1, wherein in step 2), a photolithography, masking, reactive ion etching (RIE), or plasma etching process is used to etch a plurality of grooves with parallel edges on the surface of the epitaxial substrate to form the first periodic groove;
    two ends of each of the plurality of grooves extend to two corresponding edges of the epitaxial substrate, respectively;
    a depth of each groove of the first periodic groove is a, and a is larger than or equal to 100 nm; a width of each groove of the first periodic groove is b, and b is larger than or equal to 500 nm; and a spacing between two adjacent grooves of the first periodic groove is not less than 2.5b.

4. The preparation method according to claim 1, wherein in step 3), a material of the 2D crystal transition layer is graphene or a transition metal dichalcogenide (TMDC); the thickness of the 2D crystal transition layer is larger than 10 nm, and a horizontal size of the 2D crystal transition layer is the same as a horizontal size of the epitaxial substrate; and the 2D crystal transition layer is transferred to the surface of the first periodic groove of the epitaxial substrate in an alignment manner to completely cover the surface of the epitaxial substrate.

5. The preparation method according to claim 1, wherein in step 4), a photolithography, masking, RIE, or plasma etching process is used to etch a plurality of grooves with parallel edges on the surface of the 2D crystal transition layer to form the second periodic groove;
   an edge of each of the plurality of grooves extend to an edge of the epitaxial substrate;
   a depth of each of the plurality of grooves is equal to the thickness of the 2D crystal transition layer,
   a width of each groove of the second periodic groove is less than 0.8 b, and a spacing between two adjacent grooves of the second periodic groove is not less than 2.5 b, wherein b is a width of each groove of the second periodic groove in the first periodic groove; and the period of the second periodic groove is equal to the period of the first periodic groove,
   the second periodic groove is parallel to the first periodic groove, and the planar projection of the second periodic groove falls in the first non-groove zone.

6. The preparation method according to claim 1, wherein in step 5), photolithography, masking, and plasma-enhanced chemical vapor deposition (PECVD) processes are used to deposit a 5 nm to 100 nm-thick support protective layer on the second non-groove zone with a deposition temperature of higher than 100° C.; and a material of the supporting protective layer is selected from the group consisting of amorphous silica ($SiO_2$), alumina ($Al_2O_3$), and titanium oxide ($TiO_2$).

7. The preparation method according to claim 1, wherein in step 6), the AlN-based material is deposited on the functional layer by physical vapor deposition (PVD), metal organic chemical vapor deposition (MOCVD), molecular beam epitaxy (MBE), hydride vapor phase epitaxy (HVPE), chemical vapor deposition (CVD), or pulsed laser deposition (PLD) at 300° C. to 1,300° C. to form the functional layer; the AlN-based material is one selected from the group consisting of aluminum nitride (AlN), aluminum gallium nitride (AlGaN), scandium aluminum nitride (ScAlN), and a heterostructure composed of two or more of AlN, AlGaN, and ScAlN; and a thickness of the functional layer is greater than 500 nm.

8. The preparation method according to claim 1, wherein in step 7), the thermal oxidation is conducted for more than 30 min in an oxygen atmosphere at 100° C. to 500° C., such that a structure of the 2D crystal transition layer is destroyed through a chemical reaction participated by oxygen to remove the 2D crystal transition layer.

9. The preparation method according to claim 1, wherein in step 8), the surface-conductive layer is a carbon layer; the carbon layer has a thickness of greater than 10 nm and an electric resistivity of less than 300 $\Omega \cdot m$ and is prepared through magnetron sputtering, PVD, MBE, or CVD.

10. The preparation method according to claim 1, wherein in step 8), the surface-conductive layer is a graphene layer; the graphene layer has a thickness of greater than 30 atomic layers and an electric resistivity of less than 300 $\Omega \cdot m$ and is prepared through wet transfer, dry transfer, or CVD.

* * * * *